(12) United States Patent
Lu et al.

(10) Patent No.: US 11,073,428 B2
(45) Date of Patent: Jul. 27, 2021

(54) CONDUCTIVE LINE-BASED TEMPERATURE-SENSING DEVICE

(71) Applicant: Taiwan Semiconductor Manufacturing Co., Ltd., Hsin-Chu (TW)

(72) Inventors: Shih-Lien Linus Lu, Hsinchu (TW); Ming-Hsien Lin, Hsinchu County (TW); Anthony Oates, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 266 days.

(21) Appl. No.: 16/142,934

(22) Filed: Sep. 26, 2018

(65) Prior Publication Data
US 2019/0120700 A1    Apr. 25, 2019

Related U.S. Application Data

(60) Provisional application No. 62/564,652, filed on Sep. 28, 2017.

(51) Int. Cl.
| G01K 7/00 | (2006.01) |
| G01K 7/01 | (2006.01) |
| H01L 27/02 | (2006.01) |
| G01K 3/00 | (2006.01) |
| G01K 7/20 | (2006.01) |
| G11C 7/04 | (2006.01) |
| G11C 11/412 | (2006.01) |

(52) U.S. Cl.
CPC ............... G01K 7/01 (2013.01); G01K 3/005 (2013.01); G01K 7/20 (2013.01); H01L 27/0211 (2013.01); G11C 7/04 (2013.01); G11C 11/412 (2013.01)

(58) Field of Classification Search
USPC ................................................ 327/51–55, 57
See application file for complete search history.

(56) References Cited

U.S. PATENT DOCUMENTS

| 8,810,282 | B2 * | 8/2014 | Li | H03K 5/2481 |
| | | | | 327/65 |
| 9,274,007 | B2 * | 3/2016 | Walker | G11C 11/407 |
| 2008/0235639 | A1 * | 9/2008 | Awad | G05F 1/561 |
| | | | | 716/136 |
| 2009/0296465 | A1 * | 12/2009 | Wang | G11C 7/04 |
| | | | | 365/185.2 |
| 2011/0158286 | A1 * | 6/2011 | Peterson | G01K 7/01 |
| | | | | 374/170 |
| 2013/0027015 | A1 * | 1/2013 | Park | G01K 7/021 |
| | | | | 323/285 |

(Continued)

*Primary Examiner* — Lisa M Caputo
*Assistant Examiner* — Nasir U. Ahmed
(74) *Attorney, Agent, or Firm* — Duane Morris LLP

(57) ABSTRACT

A temperature-sensing device configured to monitor a temperature includes: a first conductive line; a second conductive line, wherein the first and second conductive lines have respective different cross-sectional dimensions; a sensing circuit, coupled to the first and second conductive lines, and configured to determine a logic state of an output signal based on a difference between respective signal levels present on the first and second conductive lines; and a control circuit, coupled to the sensing circuit, and configured to determine whether the monitored temperature is above or below a pre-defined threshold temperature based on the determined logic state.

20 Claims, 7 Drawing Sheets

(56) References Cited

U.S. PATENT DOCUMENTS

| | | | |
|---|---|---|---|
| 2014/0269070 A1* | 9/2014 | Hsiung | G11C 16/26 365/185.11 |
| 2015/0110158 A1* | 4/2015 | Liu | G01K 7/21 374/184 |
| 2016/0181239 A1* | 6/2016 | Deng | H01L 21/7684 257/536 |
| 2016/0211031 A1* | 7/2016 | Taigor | G11C 7/04 |

* cited by examiner

CONDUCTIVE LINE-BASED TEMPERATURE-SENSING DEVICE

CROSS-REFERENCE TO RELATION APPLICATION

The present application claims priority to U.S. Provisional Patent Application No. 62/564,652, filed on Sep. 28, 2017, which is incorporated by reference herein in its entirety.

BACKGROUND

Aggressive technology scaling for high performance integrated circuits has resulted in higher current densities in interconnection lines and devices, which in turn increases power dissipation. Generally, a significant amount of such dissipated power converts to heat, which thus causes a substantial rise in heat density. Respective different operation modes of each of the functional blocks in a high performance integrated circuit cause temperature gradients on a respective substrate where the integrated circuit is formed. The above-mentioned scenarios lead to a need for a lightweight, robust, and power-efficient on-chip temperature-sensing device that can be used for accurate thermal mapping and thermal management.

To satisfy such needs, a variety of on-chip temperature-sensing devices have been proposed over the years such as, for example, an on-chip thermal sensor. In general, an on-chip thermal sensor is an integral part of an integrated circuit that provides one or more additional layers of protection. The on-chip thermal sensor can be used to detect whether the integrated circuit is being hacked, for example, by sensing a presence of an abnormal temperature. As such, the integrated circuit's security protection can be improved. The on-chip thermal sensor can also be used to provide feedback to other on-chip circuits/components so as to allow those on-chip circuits/components to adjust respective circuit parameter(s) for not generating excessive heat dissipation. Accordingly, the whole integrated circuit (system) can operate more efficiently and reliably.

Conventional on-chip thermal sensors typically utilize a variety of temperature-varying physical effects (e.g., voltage) to detect/measure temperature. Such conventional thermal sensors are subjected to a variety of issues when integrated into an integrated circuit. In an example, one or more diodes (p-n junction devices) are used to measure temperature by comparing respective voltage drops based on a temperature-varying characteristic of the voltage drop. However, integrating the diodes into an integrated circuit typically encounters a variety of issues, e.g., re-allocation of real estate to accommodate the diode(s) and one or more reference circuits, high power consumption of the diode(s), etc. In another example, a metal-oxide-semiconductor (MOS) transistor is used as an on-chip thermal sensor by using the MOS transistor's temperature-varying threshold voltage. Although such MOS-based thermal sensors are relatively smaller in size and have lower power consumption, integrating the MOS-based thermal sensors into an integrated circuit still encounters a variety of issues such as, for example, difficulty in scaling with other on-chip components/circuits of the integrated circuit, requiring at least one reference circuit, etc. Thus, conventional on-chip thermal sensors are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
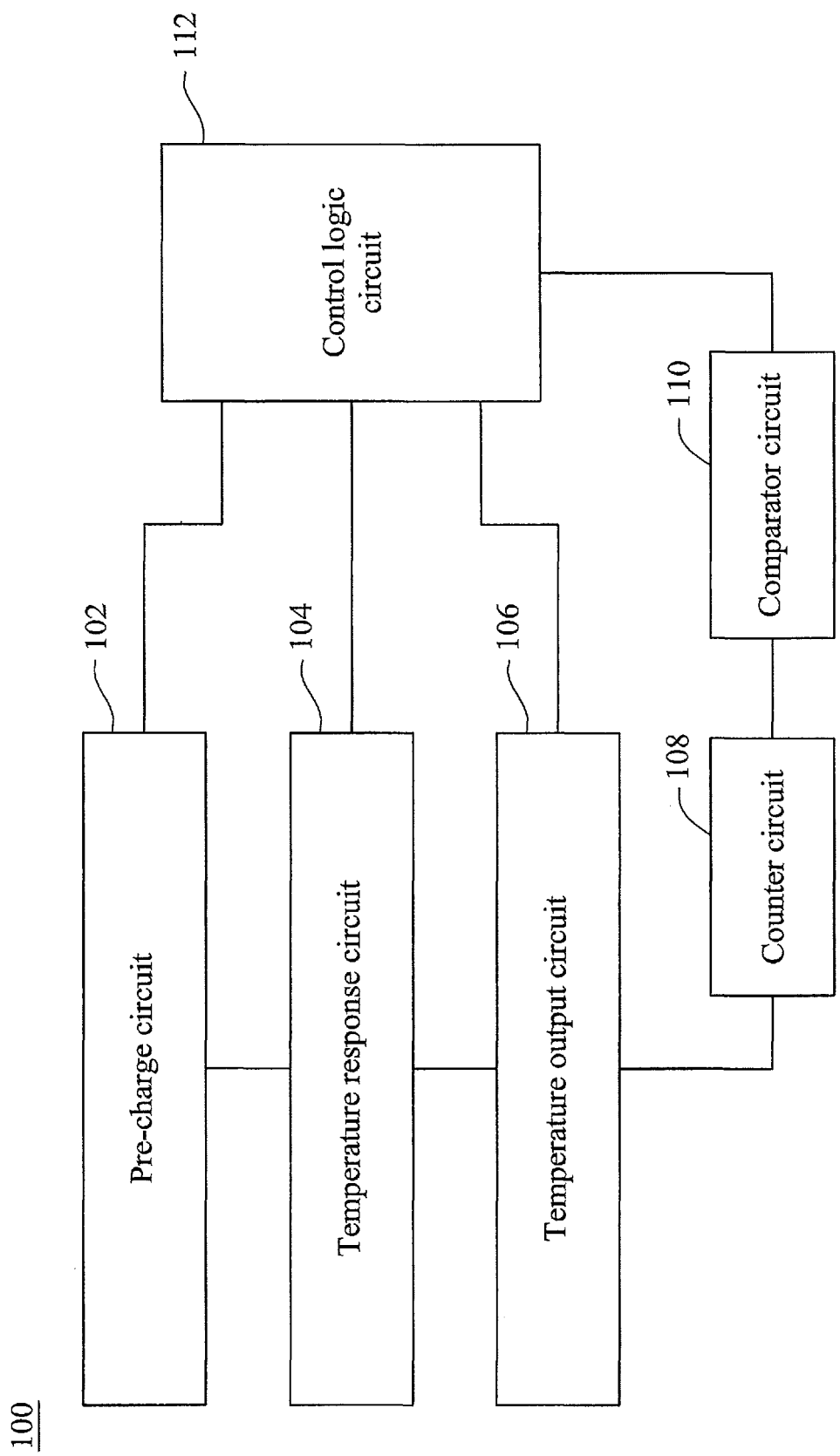
FIG. 1 illustrates a block diagram of a temperature-sensing device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a temperature-sensing device that is configured to monitor a temperature based on a geometric dimension difference of two (or more) conductive lines. In some embodiments, the disclosed temperature-sensing device may be integrated into a system circuit (e.g., a system-on-chip (SoC) circuit, a system-in-package (SiP), etc.) so as to monitor an on-chip temperature of the system circuit.

More specifically, in some embodiments, the two conductive lines may each be an interconnection line (e.g., a copper interconnection line) of the system circuit that is configured to electrically connect respective two or more devices/elements/features of the system circuit, and each of such two conductive lines has a respective different cross-sectional dimension. In some embodiments, the two conductive lines may share a same cross-sectional height but have respective different cross-sectional widths, which cause the two conductive lines to have respective different temperature coefficients of resistance (TCR's). As will be discussed in further detail below, the respective different TCR's cause the two conductive lines to have respective different resistance-temperature responses, which, in turn, causes two different discharging rates to be present on the two conductive lines. Accordingly, the temperature-sensing device compares signal (e.g., voltage, current, etc.) levels present on the two conductive lines based on the different discharging rates to determine whether the system circuit is under an abnormal temperature (e.g., above or below a pre-defined threshold temperature).

FIG. 1 illustrates a block diagram of a temperature-sensing device 100, in accordance with various embodiments. As mentioned above, the temperature-sensing device 100 is integrated into a system circuit (not shown), and configured to monitor an on-chip temperature of the system circuit. In some embodiments, the temperature-sensing device 100 includes a pre-charge circuit 102, a temperature response circuit 104, a temperature output circuit 106, a counter circuit 108, a comparator circuit 110, and a control logic circuit 112.

The pre-charge circuit 102, coupled to the control logic circuit 112, is configured to receive a pre-charge enable signal from the control logic circuit 112, as discussed in further detail below with respect to FIG. 2. In some embodiments, such a pre-charge enable signal may be received by the pre-charge circuit 102 periodically to cause the pre-charge circuit 102, in response to receiving the pre-charge enable signal at a particular logic state (e.g., a logic 0), to charge the temperature response circuit 104.

According to some embodiments of the present disclosure, the temperature response circuit 104, coupled to the pre-charge circuit 102 and the control logic circuit 112, may include at least a pair of conductive lines that have respective different cross-sectional widths (hereinafter "widths"). Using such two conductive lines with respective different widths, the two conductive lines may have respective different temperature coefficients of resistance (TCR's) thereby causing the two conductive lines to have respective different resistance-temperature responses.

In some embodiments, after the pre-charge circuit 102 charges the two conductive lines to a common voltage level, the conductive lines are discharged under a same environmental temperature (e.g., an on-chip temperature). As will be discussed in further detail below, due to the different TCR's, the two conductive lines may present respective different resistance values under the same environmental temperature and, accordingly, the two conductive lines can be discharged at different rates (i.e., the two conductive lines having respective different discharging rates), which causes respective voltage levels present on the two conductive lines to be different.

In some embodiments, the temperature output circuit 106, coupled to the temperature response circuit 104 and the control logic circuit 112, can use such a difference between the voltage levels present on the two conductive lines to determine a logic state of an output signal indicating whether the environmental temperature, sensed by the temperature response circuit 104, has reached or exceeded a pre-defined maximum threshold temperature, or fallen below a pre-defined minimum threshold temperature. In some embodiments, the temperature output circuit 106 may further provide the determined logic state to the control logic circuit 122 for the control logic circuit 122 to determine whether the environmental temperature has reached or exceeded a pre-defined maximum threshold temperature, or fallen below a pre-defined minimum threshold temperature.

Accordingly, after determining that the sensed environmental temperature is abnormal (e.g., above the pre-defined maximum threshold temperature or below the pre-defined minimum threshold temperature), the control logic circuit 112, for example, may stop sending the pre-charge enable signal to the pre-charge circuit 102 (thus causing the temperature response circuit 104 to stop sensing the environmental temperature by discharging respective voltage levels) and/or outputting an alarm signal indicating that the sensed environmental temperature is abnormal.

In some other embodiments, the temperature output circuit 106 may provide the determined logic state to the counter circuit 108. In such embodiments, the counter circuit 108 is configured to count respective numbers of logic high (i.e., logic 1) and/or low (i.e., logic 0) of the logic signal provided by the temperature output circuit 106, and to provide at least one of such counted numbers of logic high's and low's to the comparator circuit 110. The comparator circuit 110 compares the counted number to a pre-defined number (e.g., a constant number) to further confirm whether the environmental temperature has reached, exceeded, or fallen below the pre-defined threshold temperature so as to output a compared result. In some embodiments, the comparator circuit 110 then provides the compared result to the control logic circuit 112. Based on the compared result, similarly, the control logic circuit 112 may stop sending the pre-charge enable signal to the pre-charge circuit 102 (thus causing the temperature response circuit 104 to stop sensing the environmental temperature by discharging respective voltage levels) and/or outputting an alarm signal indicating that the sensed environmental temperature is abnormal (e.g., above the pre-defined maximum threshold temperature or below the pre-defined minimum threshold temperature).

Figure 2:
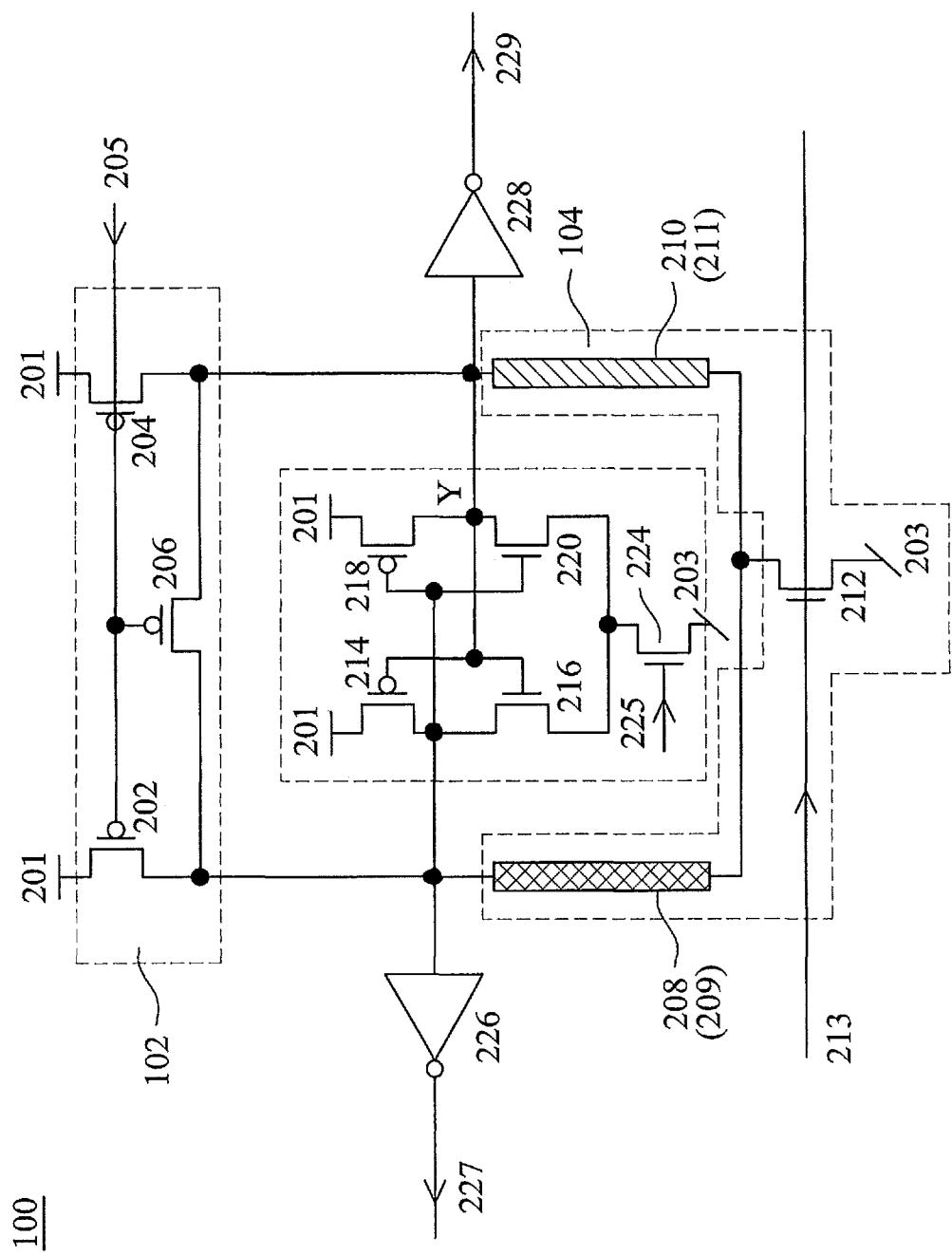
FIG. 2 illustrates an exemplary circuit diagram of part of the temperature-sensing device of FIG. 1, in accordance with some embodiments.

FIG. 2 illustrates an exemplary circuit diagram of the temperature-sensing device 100, in accordance with various embodiments. It is noted that the circuit diagram in the illustrated embodiment of FIG. 2 is simplified for purposes of explanation. The temperature-sensing device 100 may include one or more other circuit elements/devices such as, for example, resistors, capacitors, inductors, transistors, etc., which are not illustrated in FIG. 2.

As shown in FIG. 2, the pre-charge circuit 102 includes three transistors 202, 204, and 206. In some embodiments, each of the transistors 202, 204, and 206 is implemented by a p-type metal-oxide-semiconductor field-effect-transistor (pMOSFET). In some other embodiments, however, each of the transistors 202, 204, and 206 can be implemented by a different type of MOSFET (e.g., n-type) or any of a variety of other types of transistors (e.g., a bipolar junction transistor (BJT), a high-electron-mobility transistor (HEMT), or the like). In some embodiments, respective gates of the transistors 202, 204, and 206 are tied together to receive a signal 205, which is the pre-charge enable signal (provided by the control logic circuit 102) as mentioned above. The transistors 202 and 204 are coupled to a first supply voltage 201 (e.g., Vdd) at respective source ends, and coupled to the temperature response circuit 104 at respective drain ends. It is also noted that the transistor 206 is coupled to the respective drain ends of the transistors 202 and 204 at its respective drain and source ends.

The temperature response circuit 104 includes a first conductive line 208, a second conductive line 210, and a response enable transistor 212. The first conductive line 208 is coupled to the transistor 202 of the pre-charge circuit 102 at one end, and coupled to the transistor 212 at the other end; and the second conductive line 210 is coupled to the transistor 204 of the pre-charge circuit 102 at one end, and coupled to the transistor 212 at the other end. In some embodiments, the transistor 212 is implemented by an n-type MOSFET (nMOSFET) with its drain end coupled to the first and second conductive lines 208 and 210, and its source end coupled to a second supply voltage 203 (e.g., ground). Further, the transistor 212 is gated by a response enable signal 213 that is configured to enable the first and second conductive lines 208 and 210 to start sensing a temperature, which will be discussed in further detail below.

As mentioned above, in some embodiments, the first conductive line 208 and second conductive line 210 have respective different widths, wherein the width of the first conductive line 208 is narrower than the width of the second conductive line 210. For example, the width of the first conductive line 208 is about 30 nm~0.1 μm and the width of the second conductive line 210 is about 0.8~1 μm. The wider conductive line 210 may have a higher TCR than the narrower conductive line 208 thereby causing different amounts of voltage drops present on the first and second conductive lines 208 and 210 in response to a same amount of temperature change, which will be discussed in further detail below.

In some embodiments, the first and second conductive lines 208 and 210 are interconnection lines of the system circuit to which the temperature-sensing device 100 is integrated. Such interconnection lines (e.g., the first and second conductive lines 208 and 210) may be disposed on a same metal layer, which is typically configured to electrically couple one of more conductive features and/or structures disposed above or below the metal layer. However, in some alternative embodiments, the first and second conductive lines 208 and 210 may be disposed on respective different metal layers while remaining within the scope of the present disclosure.

Further, the first and second conductive lines 208 and 210 may each include an "existing" interconnection line of the system circuit, containing the temperature-sensing device 100, as mentioned above. For example, when the system circuit is a memory circuit (e.g., an SRAM circuit), the temperature-sensing device 100, integrated into such a memory circuit, may use existing bit lines (BL's) and/or bit bar lines (BBL's) of the memory circuit as the first and second conductive lines 208 and 210. Thus, despite not shown in FIG. 2, the first and second conductive lines 208 and 210 may be coupled to one or more memory bit cells, e.g., a six-transistor memory bit cell.

The temperature output circuit 106 includes transistors 214, 216, 218, 220, and 224, and inverters 226 and 228. The transistors 214 and 218 are each implemented by a pMOSFET; and the transistors 216, 220, and 224 are each implemented by an nMOSFET. Similarly, each of the transistors 214, 216, 218, 220, and 224 can be implemented by a different type of MOSFET or any of a variety of other types of transistors (e.g., a BJT, a HEMT, or the like). In some embodiments, the temperature output circuit 106 may include a sensing amplifier formed by the transistors 214, 216, 218, and 220, which can be a differential voltage-mode or current-mode sensing amplifier.

In FIG. 2 where the temperature output circuit 106 includes a differential voltage-mode sensing amplifier formed by the transistors 214, 216, 218, and 220, the transistors 214 and 216 are formed as a first inverter, and the transistors 218 and 220 are formed as a second inverter, wherein the first and second inverters are cross-coupled with each other between the first supply voltage 201 and the transistor 224. The transistor 224 is coupled between the cross-coupled first and second inverters (formed by the transistors 214-216 and 218-220, respectively) and the second supply voltage 203. The inverter 226 is coupled to the first conductive line 208, at node "X" of the first inverter (respective drain ends of the transistors 214 and 216), and further to respective gate ends of the transistors 218 and 220; and the second inverter 228 is coupled to the second conductive line 210, at node "Y" of the second inverter (respective drain ends of the transistors 218 and 220), and further to respective gate ends of the transistors 214 and 216.

In some embodiments, the transistor 224 is gated by a sense enable signal 225 that is configured to enable the temperature output circuit 106 to sense and amplify a voltage difference between the first and second conductive lines 108 and 210. When the voltage difference is large enough (e.g., larger than a pre-defined threshold) that may be indicative of a presence of an abnormal temperature in accordance with some embodiments of the present disclosure, the temperature output circuit 106 can amplify the voltage difference and cause the inverters 226 and 228 to output corresponding logic states for the signals 227 and 229, respectively, which will be discussed in further detail below with respect to FIG. 4.

As mentioned above, the first conductive line 208 and the second conductive line 210 have respective different TCR's because of their respective different widths. In some embodiments, a conductive line's TCR can be expressed as, $$TCR = \frac{(R - R_{ref})}{R_{ref}(T - T_{ref})},$$

wherein "T" is referred to as a current environmental temperature (e.g., an on-chip temperature) that the conductive line is experiencing (e.g., sensing), "R" is referred to as a resistance value of the conductive line under the current environmental temperature T, "$T_{ref}$" is referred to as a reference temperature (e.g., a pre-defined maximum/minimum threshold temperature), "$R_{ref}$" is referred to as a resistance value of the conductive line under the reference temperature $T_{ref}$.

Continuing with the illustrated embodiment of FIG. 2 where the second conductive line 210 is "wider" than the first conductive line 208, the first conductive line 208's TCR (hereinafter "$TCR_1$") is smaller than the second conductive line 210's TCR (hereinafter "$TCR_2$"), as known by persons of ordinary skills in the art. In general, the first conductive line 208 with the lower $TCR_2$ presents a smaller resistance value change in response to an amount of temperature change; and the second conductive line 210 with the higher $TCR_2$ presents a larger resistance value change in response to the same amount of temperature change.

Further, based on the above-provided TCR equation $$\left(TCR = \frac{(R - R_{ref})}{R_{ref}(T - T_{ref})}\right),$$

when the current environmental temperature T sensed by the first and second conductive lines 208 and 210 is lower than the reference temperature $T_{ref}$ (i.e., $T<T_{ref}$), the first conductive line 208's resistance value (hereinafter "$R_1$") is higher than the second conductive line 208's resistance value (hereinafter "$R_2$"), and both $R_1$ and $R_2$ are lower than $R_{ref}$ (i.e., $R_2<R_1<R_{ref}$). On the other hand, when the current environmental temperature T sensed by the first and second conductive lines 208 and 210 is higher than the reference temperature $T_{ref}$ (i.e., $T>T_{ref}$), based on the above-provided TCR equation, $R_1$ becomes lower than $R_2$, and both $R_1$ and $R_2$ are higher than $R_{ref}$ (i.e., $R_2>R_1>R_{ref}$).

Figure 3:
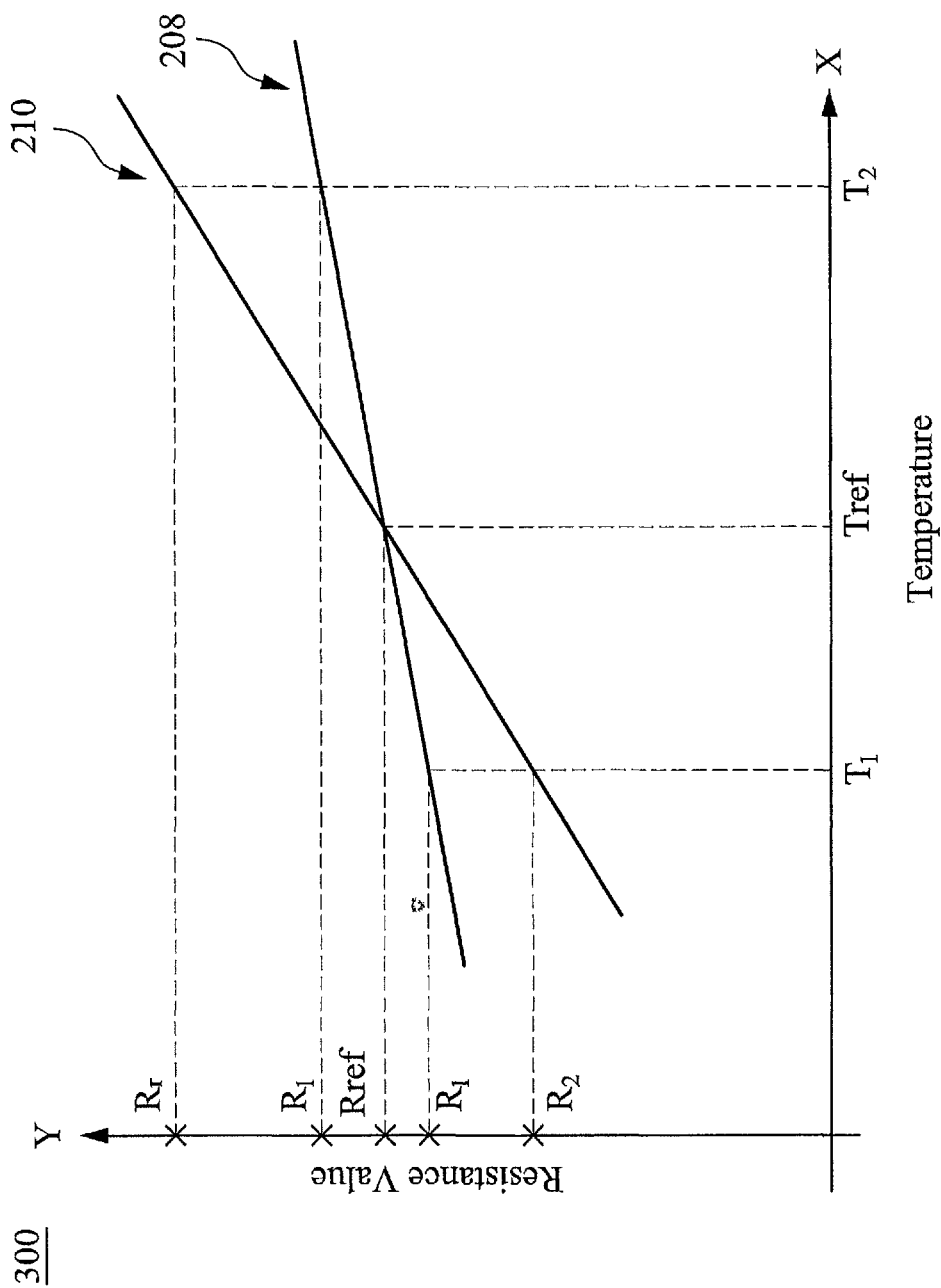
FIG. 3 illustrates an exemplary plot showing respective relationships between resistance values and temperatures of two conductive lines of the temperature-sensing device of FIG. 1, in accordance with some embodiments.

Such relationships between the resistance values and the environmental temperatures of the first and second conductive lines 208 and 210 are illustrated in plot 300 of FIG. 3. The X axis of the plot 300 represents a variable of temperature (e.g., the environmental temperature T) and the Y axis of the plot 300 represents a variable of resistance value (e.g., $R_1$ and $R_2$). As shown, the resistance values of the first and second conductive lines 208 and 210 are each represented as a function of the temperature. In particular, when $T_1<T_{ref}$, $R_1$ is higher than $R_2$, and $R_{ref}$ is higher than $R_1$; and when $T_2>T_{ref}$, $R_2$ is higher than $R_1$, and $R_1$ is higher than $R_{ref}$.

Using such relationships of the resistance values versus temperatures, the first and second conductive lines 208 and 210 can be used by the temperature-sensing device 100 to monitor an increasing and/or decreasing environmental temperature, and further determine whether the increasing temperature exceeds a pre-defined threshold temperature and/or the decreasing temperature falls below the pre-defined threshold temperature, as will be discussed below.

Figure 4:
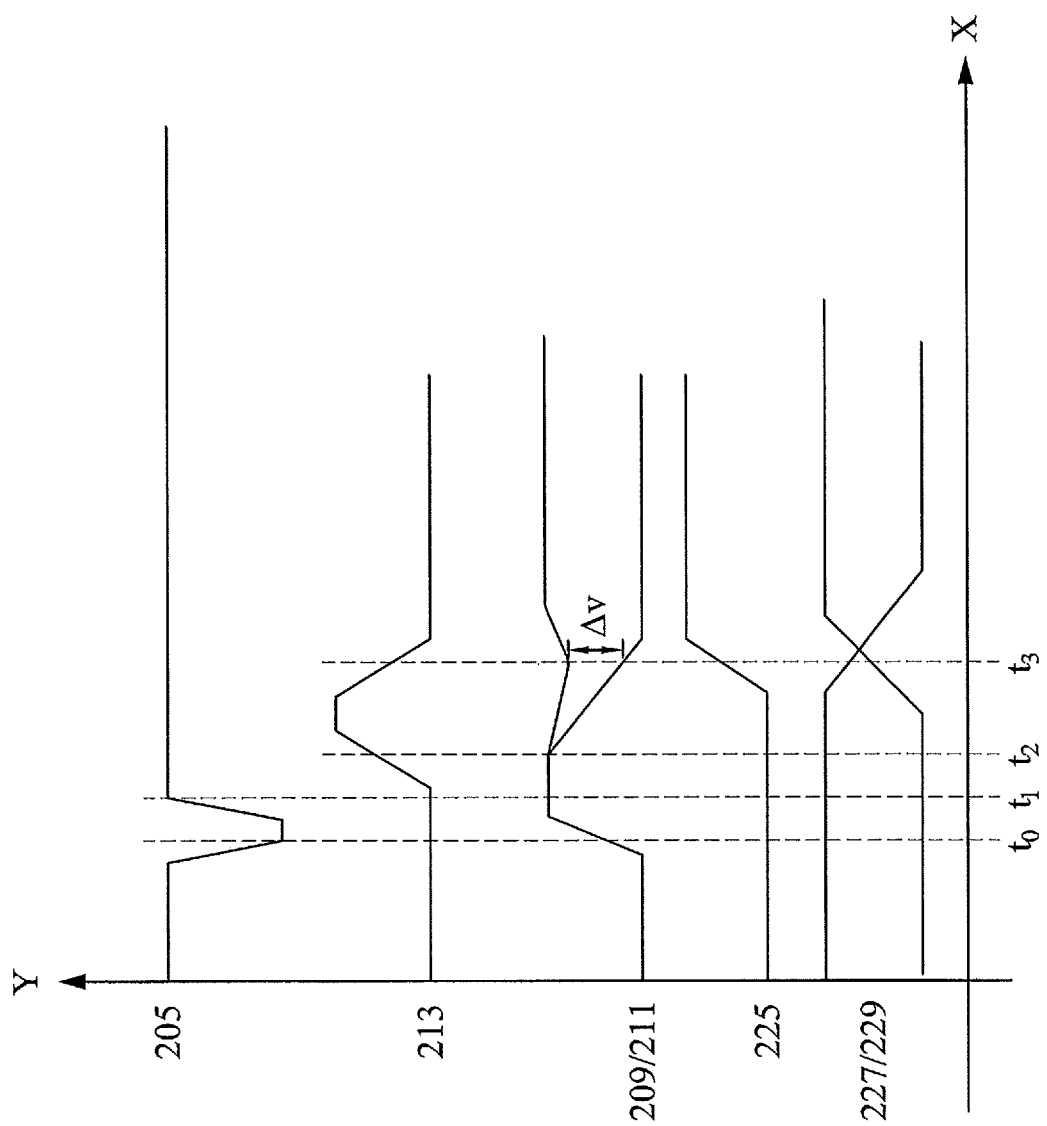
FIG. 4 illustrates exemplary waveforms of plural signals to operate the temperature-sensing device of FIG. 1, in accordance with some embodiments.

FIG. 4 illustrates exemplary waveforms of the pre-charge enable signal 205, the response enable signal 213, voltage levels present on the first and second conductive lines 208 and 210 (hereinafter "signal 209" and "signal 211" respectively), the sense enable signal 225, respective output signals of the inverters 226 and 228 (hereinafter "signal 227" and "signal 229" respectively), respectively, in accordance with various embodiments. Each of the signals 205, 209, 211, 213, 225, 227, and 229 varies between a logic high, hereinafter a "logic 1," and a logic low, hereinafter a "logic 0," (along the Y axis in FIG. 4) over time (along the X axis in FIG. 4). For example, the signals 209 and 211 each transitions from Vdd (e.g., the logic 1) toward ground (e.g., the logic 0) with a respective "discharging rate" over time, which will be discussed in further detail below.

To operate the temperature-sensing device 100 (FIG. 1), the control logic circuit 112 periodically (e.g., every 10 millisecond) provides the pre-charge enable signal 205 to the pre-charge circuit 102. More specifically, the pre-charge enable signal 205 includes a plurality of pulses transitioning between the logic 0 and logic 1 over time, wherein each of the plurality of pulses may represent an iteration of temperature-sensing event. In the illustrated embodiment of FIG. 4, one pulse is shown, i.e., one iteration of temperature-sensing event. And the pulse of the pre-charge enable signal 205 transitions from the logic 1 to logic 0 at time "t0," which causes the transistors 202, 204, and 206 of the pre-charge circuit 102 to be turned on so as to pre-charge the first and second conductive lines 208 and 210 using the first supply voltage 201 (Vdd). In some embodiments, the first and second conductive lines 208 and 210 are pre-charged to Vdd, which corresponds to the logic 1 at time "t1," as shown in the waveforms of signals 209 and 211. In some embodiments, the pre-charge enable signal 205 may transition back to the logic 1 at or after time t1, which stops pre-charging the first and second conductive lines 208 and 210.

At a subsequent time "t2," the response enable signal 213 transitions from the logic 0 to logic 1, which causes the first and second conductive lines 208 and 210 to be coupled to the second supply voltage, e.g., ground. In some embodiments, the control logic circuit 112 may periodically cause the response enable signal 213 to transition between the logic 0 and logic 1 over time in accordance with the pre-charge enable signal 205. In other words, when the control logic circuit 112 causes the pre-charge enable signal 205 to transition from the logic 0 back to logic 1, the control logic circuit 112 causes the response enable signal 213 to transition from the logic 0 to logic 1.

When the response enable signal 213 transitions from the logic 0 to logic 1, respective discharging paths are formed along the first and second conductive lines 208 and 210. More specifically, the signal 209 (the voltage level present on the first conductive line 208) and the signal 211 (the voltage level present on the second conductive line 210) start transitioning from the logic 1 toward logic 0 with respective discharging rates due to their respective different resistance values. In some embodiments, the first and second conductive lines 208 and 210 have respective different resistance values because of their respective different TCR's, which is due to their respective different widths.

Accordingly, an increasing voltage difference between the signals 209 and 211 may be present over time. Once the voltage difference is large enough to exceed a pre-defined voltage $\Delta V$, e.g., at time "t3," the sense enable signal 225 transitions form the logic 0 to logic 1 such that the sensing amplifier of the temperature output circuit 106, constructed by the transistors 214, 216, 218, and 220, is activated. In some embodiments, a timing of the time t3 may be predetermined based on various design factors of the temperature-sensing device 100.

In some embodiments, the sensing amplifier receives the signals 209 and 211 as input signals. More specifically, the signal 209 is received by the second inverter (the transistors 218 and 220) and also at the node X; and the signal 211 is received by the first inverter (the transistors 214 and 216) and also the node Y. The sensing amplifier can use the large enough voltage difference between the signals 209 and 211 (i.e., a voltage difference between the nodes X and Y) to determine respective logic states of the signals 209 and 211, which are logically complementary to each other.

For example, when the signal 209 becomes lower than the signal 211 by the large enough voltage difference, the transistor 216 of the first inverter and the transistor 220 of the second inverter transition from a saturation mode to a cut-off mode and a triode mode, respectively, which causes the nodes X and Y to be latched at the logic 0 and 1, respectively; and, on the other hand, when the signal 209 becomes higher than the signal 211 by the large enough voltage difference, the transistors 216 and 220 transition from the saturation mode to the triode mode and the cut-off mode, respectively, which causes the nodes X and Y to be latched at the logic 1 and 0, respectively. In some embodiments, the temperature output circuit 106 outputs the signals 227 and 229 based on the determined logic states of the signals 209 and 211 (i.e., the logic states of the nodes X and Y), respectively. In particular, the signal 227 is logically inverted to the logic state of the signal 209, and the signal 229 is logically inverted to the logic state of the signal 211.

As mentioned above, the waveforms illustrated in FIG. 4 represent a single iteration of temperature-sensing event performed by the temperature-sensing device 100 to monitor a current environmental temperature. Since, in some embodiments, the control logic circuit 112 periodically transitions the pre-charge enable signal 205 and the response enable signal 213 between the logic 0 and logic 1 over time in an according manner, the temperature-sensing device 100 may perform plural such iterations of the temperature-sensing event over time to monitor an environmental temperature that may increase or decrease over time.

In an example in which the temperature-sensing device 100 monitors an increasing environmental temperature, referring again to FIG. 3, the reference temperature $T_{ref}$ may be selected as the pre-defined threshold temperature, and the temperature-sensing device 100 may be placed under an environmental temperature T originally lower than the pre-defined threshold temperature $T_{ref}$ but expected to increase. In some embodiments, the first and second conductive lines 208 and 210 are pre-calibrated to present a same resistance value, i.e., $R_{ref}$, under the pre-defined threshold temperature $T_{ref}$. Various ways may be employed to cause the first and second conductive lines 208 and 210 to have the same resistance value $R_{ref}$ under the pre-defined threshold temperature $T_{ref}$, for example, making the first and second conductive lines 208 and 210 long enough, e.g., at least about a few thousands μm.

As such, when the environmental temperature T (e.g., $T_1$ in FIG. 3) is lower than the pre-defined threshold temperature $T_{ref}$, since $R_2$ (the resistance value presented by the second conductive line 210) is lower than $R_1$ (the resistance value presented by the first conductive line 208), the first conductive line 208 may present a higher discharging rate than the second conductive line 210. Following the operation of the temperature-sensing device 100 discussed with respect to FIG. 4, when the first and second conductive lines 208 and 210 are enabled to be discharged (e.g., at time t2 of an initial iteration), the voltage levels presented by the first and second conductive lines 208 and 210 (i.e., signals 209 and 211) may diverge to present an increasing voltage difference between the signals 209 and 211. In the current example, since the first conductive line 208 is discharged faster than the second conductive line 210, the signal 209 may be lower than the signal 211 (i.e., the signal 211 minus the signal 209 is positive).

When the voltage difference between the signals 209 and 211 keeps increasing, a large enough voltage difference (e.g., at time t3 of the initial iteration) can be used by the temperature output circuit 106 to determine the logic states of the signals 209 and 211 to be the logic 0 and 1, respectively, for example, and then output the signals 227 (logically inverted to the signal 209) and 229 (logically inverted to the signal 211) as the logic 1 and 0, respectively. In some embodiments, the control logic circuit 112 may receive and store respective logic states of the signals 227 and 229, or one of them (since they are logically complementary). In some embodiments, one or more additional iterations may be performed by the control logic circuit 112, and corresponding logic states of the signals 227 and 229 are received and stored by the control logic circuit 112 accordingly.

When the environmental temperature T (e.g., $T_2$ in FIG. 3) increases to be higher than the pre-defined threshold temperature $T_{ref}$, $R_2$ becomes higher than $R_1$, which causes the second conductive line 210 to present a higher discharging rate than the first conductive line 208. Still following the operation of the temperature-sensing device 100 discussed above, when both the first and second conductive lines 208 and 210 are enabled to be discharged (e.g., at time t2 of a subsequent iteration), the voltage levels (i.e., signals 209 and 211) may diverge to present an increasing voltage difference between the signals 209 and 211. Since the second conductive line 210 becomes to be discharged faster than the first conductive line 208, the signal 209 may be higher than the signal 211 (i.e., the signal 211 minus the signal 209 becomes negative).

Similarly, when the voltage difference between the signals 209 and 211 keeps increasing, a large enough voltage difference between the signals 209 and 211 (e.g., at time t3 of the subsequent iteration) can be used by the temperature output circuit 106 to output the signals 227 and 229 as the logic 0 and 1, respectively, for example. It is noted that the logic states of the signals 227 and 229 are flipped. This is because when the environmental temperature T exceeds the pre-defined threshold temperature $T_{ref}$, as mentioned above, the second conductive line 210 becomes to be discharged faster than the first conductive line 208 to cause the temperature output circuit 106 to determine the respective logic states of the signals 209 and 211 to be the logic 1 and 0.

As mentioned above, the control logic circuit 112 stores respective logic states of at least one of the signals 227 and 229, which are the logic 0 and 1 in the current example, for each of the previous iterations. Thus, in some embodiments, based on a detected presence of such a flipped logic states of the signals 227 and 229 (e.g., respectively flipping to the logic 1 and 0), the control logic circuit 112 can accordingly determine that environmental temperature T has exceeded the pre-defined threshold temperature $T_{ref}$.

In another example in which the temperature-sensing device 100 monitors a decreasing environmental temperature, the temperature-sensing device 100 may be placed under an environmental temperature T originally higher than the pre-defined threshold temperature $T_{ref}$ but expected to decrease. Following the above-described operation, the control logic circuit 112 can determine whether that environmental temperature T has fallen below the pre-defined threshold temperature $T_{ref}$ based on a detected presence of the flipping of the logic states of the signals 227 and 229.

Figure 5:
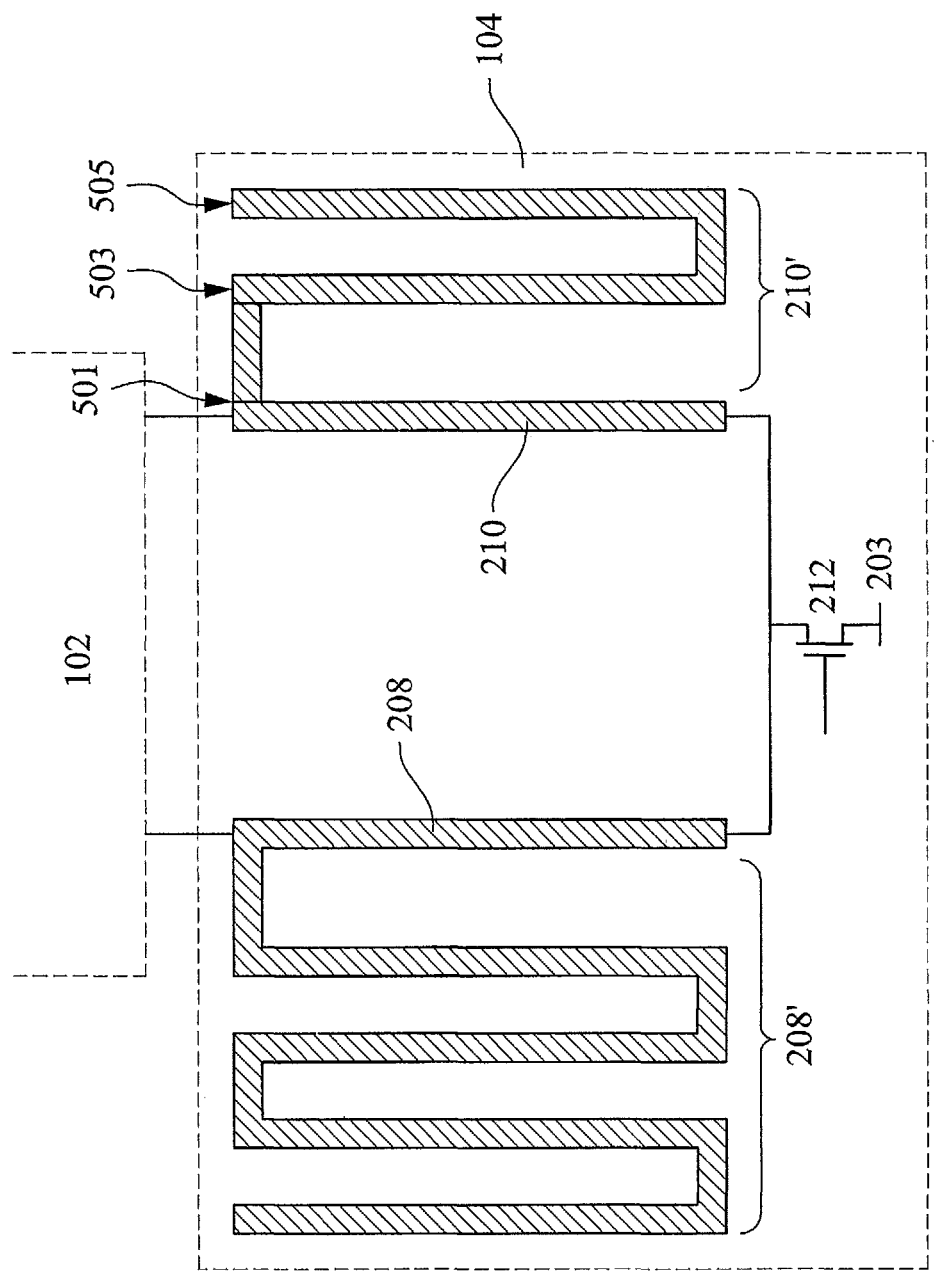
FIG. 5 illustrates another exemplary circuit diagram of part of the temperature-sensing device of FIG. 1, in accordance with some embodiments.

FIG. 5 illustrates another exemplary circuit diagram of part of the temperature-sensing device 100, in accordance with various embodiments. As shown, the first conductive line 208 and/or the second conductive line 210 may include a respective dummy conductive line 208' and 210'. Such dummy conductive lines 208' and 210' may be used to balance respective capacitance values of the first and second conductive lines 208 and 210. In some embodiments, the dummy conductive line 208' may be coupled to the first conductive line 208 at one end with the other end floating; and the dummy conductive line 210' may be coupled to the second conductive line 210 at one end with the other end floating. As such, the respective resistance values $R_1$ and $R_2$ of the first and second conductive lines 208 and 210 may remain unchanged while simultaneously balancing the capacitance values of the first and second conductive lines 208 and 210.

Further, in some embodiments, each of the dummy conductive lines 208' and 210' may provide one or more additional "tap" locations for the respective conductive lines 208 and 210 to change the resistance values $R_1$ and $R_2$, if desired. For example, the dummy conductive line 210' provides additional tap locations 503 and 505. Therefore, when the resistance value $R_2$ is to be increased, a tap location where the second conductive line 210 is coupled to the pre-charge circuit 102 can be changed. In an example, the second conductive line 210 may be coupled to the pre-charge circuit 102 at an original tap location 501. When the resistance value $R_2$ is increased, the tap location may be changed from 501 to 503 or 505.

Figure 6:
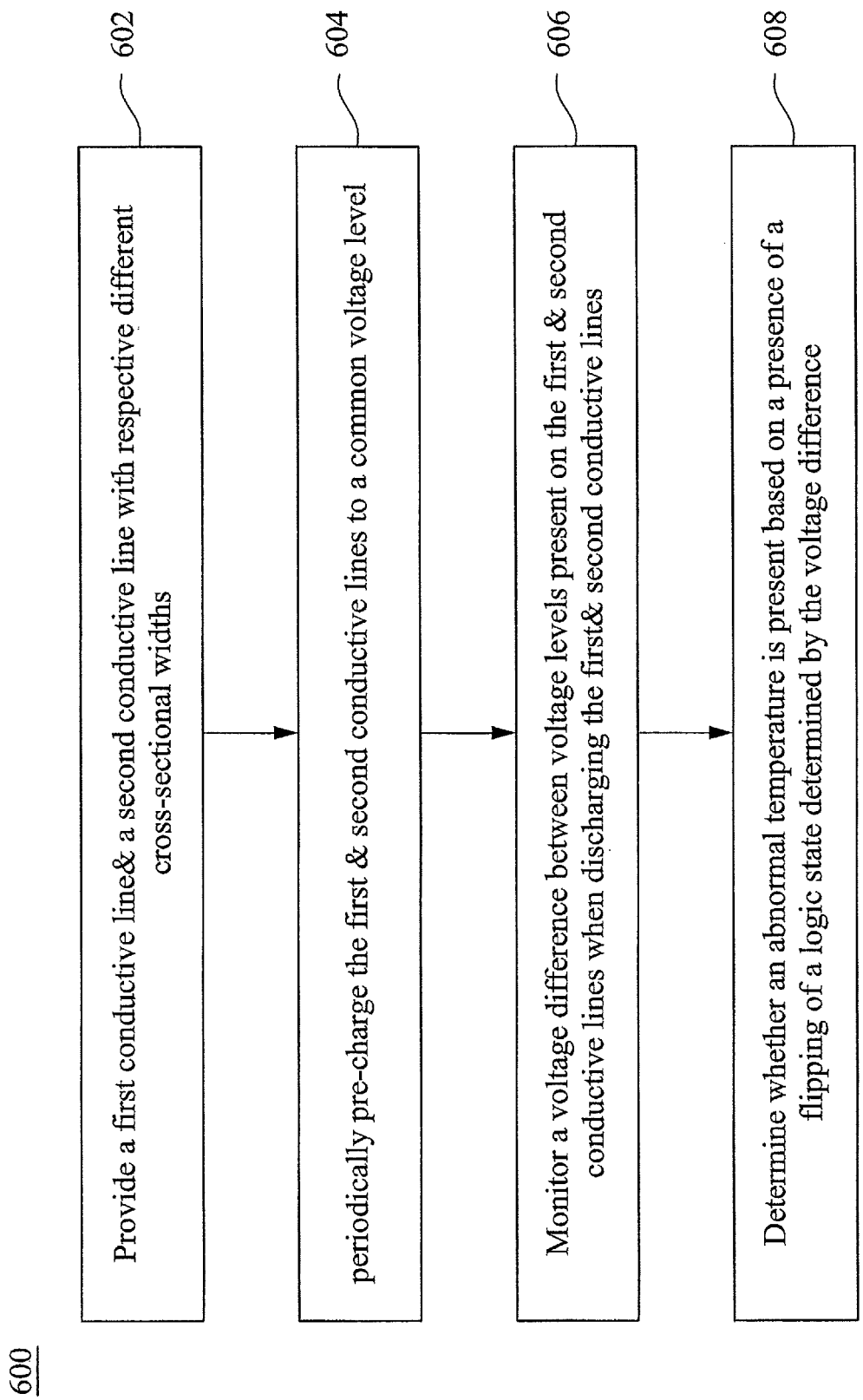
FIG. 6 illustrates a flow chart of an exemplary method to operate the temperature-sensing device of FIG. 1, in accordance with some embodiments.

FIG. 6 illustrates a flow chart of an exemplary method 600 to operate the temperature-sensing device 100, in accordance with various embodiments. In various embodiments, the operations of the method 600 are performed by the respective components illustrated in FIGS. 1-5. For purposes of discussion, the following embodiment of the method 600 will be described in conjunction with FIGS. 1-5. The illustrated embodiment of the method 600 is merely an example. Therefore, it should be understood that any of a variety of operations may be omitted, re-sequenced, and/or added while remaining within the scope of the present disclosure.

The method 600 starts with operation 602 in which a first conductive line and a second conductive line that have respective different cross-sectional widths (widths) are provided, in accordance with various embodiments. Using the above example in FIGS. 1-5, the first conductive line 208 has a narrower width, and the second conductive line 210 has a wider width, which causes the first conductive line 208 to have a smaller TCR, and the second conductive line 210 to have a larger TCR. As mentioned above, the first and second conductive lines 208 and 210 have a same resistance value under the reference temperature $T_{ref}$, which is used as the pre-defined threshold temperature.

The method 600 continues to operation 604 in which the first and second conductive lines are periodically pre-charged to a common voltage level, in accordance with various embodiments. In the same example, the first and second conductive lines 208 and 210 of the temperature response circuit 104 are periodically pre-charged to a common voltage level, e.g., Vdd (the logic 1), by the pre-charge circuit 102.

The method 600 continues to operation 606 in which a voltage difference between voltage levels present on the first and second conductive lines is periodically monitored when discharging the first and second conductive lines, in accordance with various embodiments. Continuing with the same example, after the first and second conductive lines 208 and 210 are pre-charged to the logic 1, the first and second conductive lines 208 and 210 are enabled to be discharged.

As mentioned above, since the first conductive line 208 has the smaller TCR and the second conductive line 210 has the larger TCR, the first conductive line 208 presents a higher resistance value than the second conductive line 210 when the environmental temperature is lower than the pre-defined threshold temperature $T_{ref}$; and the first conductive line 208 presents a lower resistance value than the second conductive line 210 when the environmental temperature is higher than the pre-defined threshold temperature $T_{ref}$.

As such, the first conductive line 208 may be discharged faster than the second conductive line 210 when the environmental temperature is lower than the pre-defined threshold temperature $T_{ref}$; and the second conductive line 210 may be discharged faster than the first conductive line 208 when the environmental temperature is higher than the pre-defined threshold temperature $T_{ref}$. The different discharging rates of the first and second conductive lines 208 and 210 cause the voltage difference between the voltage levels present on the first and second conductive lines to increase over time, which allows the temperature output circuit 106 to determine respective logic states of its output signals 227 and 229.

The method 600 continues to operation 608 in which a flipped logic state, determined by the voltage difference, is detected to determine whether an abnormal temperature is present, in accordance with various embodiments. Still using the same example, the temperature output circuit 106 may periodically provide the determined logic states of the signals 227 and 229 to the control logic circuit. As mentioned above, when the environmental temperature is lower than the pre-defined threshold temperature $T_{ref}$, the signals 227 and 229 may be determined as the logic 1 and 0, respectively; and when the environmental temperature becomes larger than the pre-defined threshold temperature $T_{ref}$, the signals 227 and 229 may be determined as the logic 0 and 1, respectively. In other words, the logic states of the signals 227 and 229 are flipped. In accordance with some embodiments, the control logic circuit 112 may determine that the environmental temperature has become larger than the pre-defined threshold temperature $T_{ref}$ based on the presence of such a flipping of the logic states of the signals 227 and 229.

Figure 7:
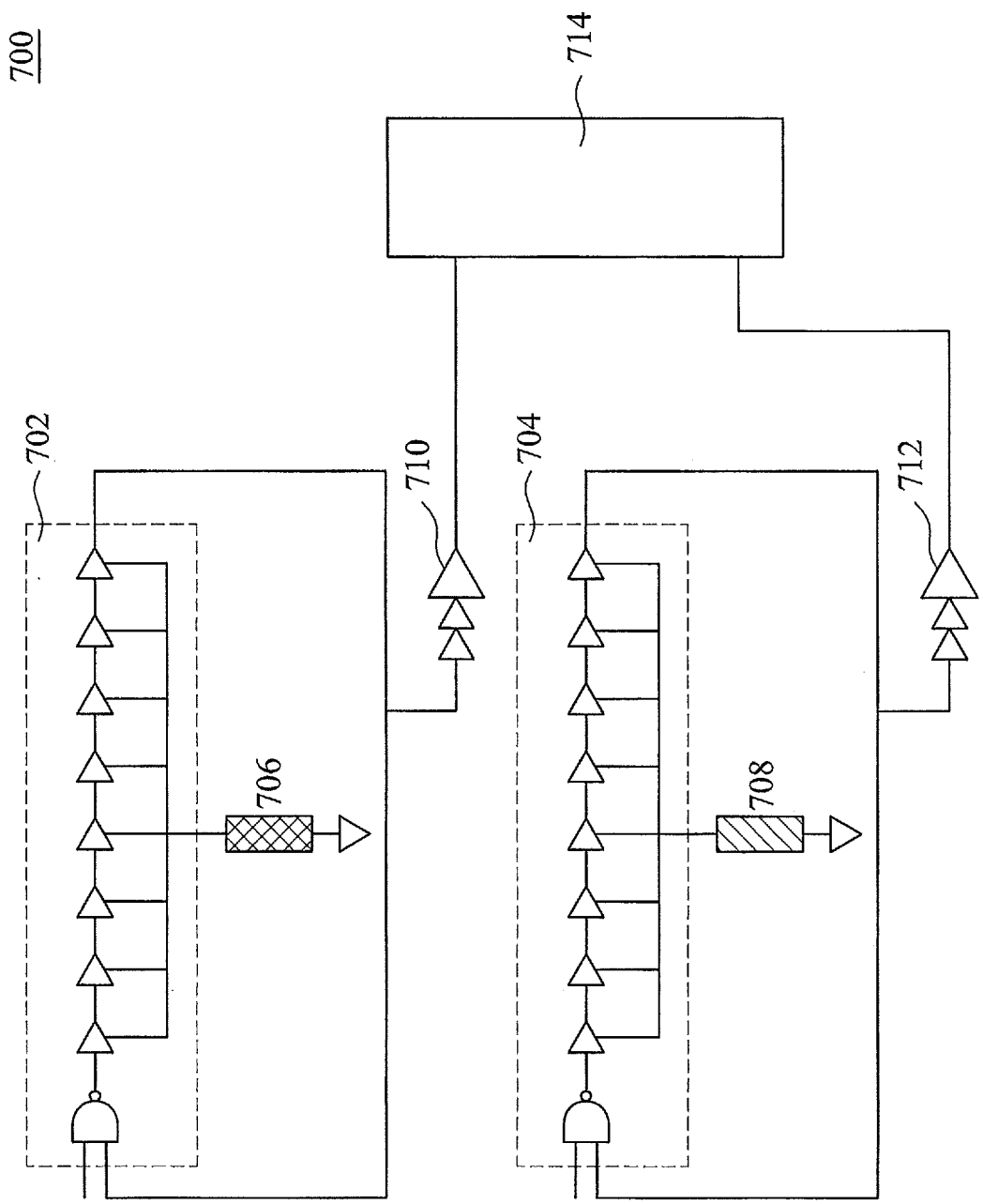
FIG. 7 illustrates a circuit diagram of another temperature-sensing device, in accordance with some embodiments.

FIG. 7 illustrates a circuit diagram of another temperature-sensing device 700. In accordance with some embodiments, the temperature-sensing device 700 also uses the respective different TCR's presented by two conductive lines with respective different cross-sectional widths to generate different signals, but in the illustrated embodiment of FIG. 7, the temperature-sensing device 700 relies on such different TCR's to generate two signals with different frequencies so as to determine whether an abnormal temperature is present.

In some embodiments, the temperature-sensing device 700 includes a first ring oscillation circuit 702, a second ring oscillation circuit 704, a first conductive line 706 coupled to the first ring oscillation circuit 702, a second conductive line 708 coupled to the second ring oscillation circuit 704, one or more first buffers 710, one or more second buffers 712, and a digital counter 714.

As mentioned above, in some embodiments, the first conductive line 706 and second conductive line 708 have respective different widths, wherein the width of the first conductive line 706 is narrower than the width of the second conductive line 708. For example, the width of the first conductive line 706 is about 30 nm~0.1 µm and the width of the second conductive line 708 is about 0.8~1 µm. The wider conductive line 708 may have a higher TCR than the narrower conductive line 706 thereby causing different amounts of voltage drops present on the first and second conductive lines 706 and 708 in response to a same amount of temperature change, which will be discussed in further detail below.

In some embodiments, the first conductive line 706 and second conductive line 708 are calibrated to have a same resistance at a given temperature. At this point, the first ring oscillation circuit 702 and second ring oscillation circuit 704 should have a same oscillation frequency. As the temperature changes, the resistances of the first conductive line 706 and second conductive line 708 may change differently. With different resistance, the first ring oscillation circuit 702 and second ring oscillation circuit 704 may oscillate at respective different oscillation frequencies, which can be differentiated by the digital counter 714 so as to read the temperature based on a pre-calibrated relationship between the temperature and resistance In an embodiment, a temperature-sensing device configured to monitor a temperature includes: a first conductive line; a second conductive line, wherein the first and second conductive lines have respective different cross-sectional dimensions; a sensing circuit, coupled to the first and second conductive lines, and configured to determine a logic state of an output signal based on a difference between respective signal levels present on the first and second conductive lines; and a control circuit, coupled to the sensing circuit, and configured to determine whether the monitored temperature is above or below a pre-defined threshold temperature based on the determined logic state.

In another embodiment, a temperature-sensing device configured to monitor a temperature includes: a first conductive line; a second conductive line, wherein the first and second conductive lines have respective different cross-sectional dimensions; a sensing circuit, coupled to the first and second conductive lines, and configured to determine a logic state of an output signal based on a difference between respective voltage levels present on the first and second conductive lines when the first and second conductive lines are discharged; and a control circuit, coupled to the sensing circuit, and configured to determine whether the monitored temperature is above or below a pre-defined threshold temperature based on the determined logic state.

Yet in another embodiment, a method includes: providing a first conductive line and a second conductive line, wherein the first and second conductive line have respective different cross-sectional widths; charging the first and second conductive lines to a common voltage level; discharging the first and second conductive lines under an environmental temperature; determining a current logic state based on a voltage difference of respective discharging voltage levels present on the first and second conductive lines; and determining whether the environmental temperature is above or below a pre-defined threshold temperature based on whether the current logic state is flipped from a previous logic state.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A temperature-sensing device configured to monitor a temperature, comprising:
   a first conductive line;
   a second conductive line, wherein the first and second conductive lines have respective different cross-sectional dimensions;
   a sensing circuit, coupled to the first and second conductive lines, and configured to determine a logic state of an output signal based on a difference between respective signal levels present on the first and second conductive lines, wherein the determined logic state indicates a value of the monitored temperature;
   a control logic circuit, coupled to the sensing circuit, and configured to determine whether the monitored temperature is above or below a pre-defined threshold temperature based on the determined logic state; and
   a pre-charge circuit, coupled to the control logic circuit, and configured to periodically receive from the control logic circuit a pre-charge enable signal at a particular state that causes the pre-charge circuit to charge the first and second conductive lines.

2. The device of claim 1, wherein the first and second conductive lines have respective different cross-sectional widths such that the first and second conductive lines have respective different resistance values under a same temperature.

3. The device of claim 1, wherein the signal levels present on the first and second conductive lines each comprises a discharging voltage level via a respective discharging rate.

4. The device of claim 1, wherein the control logic circuit is configured to determine whether the monitored temperature is above or below the pre-defined threshold temperature further based on a flipped logic state of the determined logic state.

5. The device of claim 1, wherein the first and second conductive lines each comprises a bit line or a bit bar line of a memory device.

6. The device of claim 1, wherein the first and second conductive lines have a same resistance value when the monitored temperature is equal to the pre-defined threshold temperature.

7. The device of claim 1, wherein the sensing circuit is further configured to determine the logic state as a first value indicating that the monitored temperature is above the pre-defined threshold temperature.

8. The device of claim 7, wherein the sensing circuit is further configured to determine the logic state as a second value opposite to the first value indicating that the monitored temperature is below the pre-defined threshold temperature.

9. The device of claim 8, further comprising:
   a counter circuit, coupled to the sensing circuit, and configured to count respective numbers of the first and second values.

10. The device of claim 9, further comprising:
    a comparator circuit, coupled to the counter circuit, and configured to compare the number of the first value with a pre-defined number so as to allow the control logic circuit to further determine whether the monitored temperature is above the pre-defined threshold temperature, and compare the number of the second value with the pre-defined number so as to allow the control logic circuit to further determine whether the monitored temperature is below the pre-defined threshold temperature.

11. A temperature-sensing device configured to monitor a temperature, comprising:
    a first conductive line;
    a second conductive line, wherein the first and second conductive lines have respective different cross-sectional dimensions;
    a sensing circuit, coupled to the first and second conductive lines, and configured to determine a logic state of an output signal based on a difference between respective voltage levels present on the first and second conductive lines when the first and second conductive lines are discharged, wherein the determined logic state indicates a value of the monitored temperature;
    a control logic circuit, coupled to the sensing circuit, and configured to determine whether the monitored temperature is above or below a pre-defined threshold temperature based on the determined logic state; and
    a pre-charge circuit, coupled to the control logic circuit, and configured to periodically receive from the control logic circuit a pre-charge enable signal at a particular state that causes the pre-charge circuit to charge the first and second conductive lines.

12. The device of claim 11, wherein the control logic circuit is configured to determine whether the monitored temperature is above or below the pre-defined threshold temperature further based on a flipped logic state of the determined logic state.

13. The device of claim 11, wherein the first and second conductive lines have respective different cross-sectional widths such that the first and second conductive lines have respective different resistance values under a same temperature.

14. The device of claim 11, wherein the first and second conductive lines each comprises a bit line or a bit bar line of a memory device.

15. The device of claim 11, wherein the first and second conductive lines have a same resistance value when the monitored temperature is equal to the pre-defined threshold temperature.

16. The device of claim 11, wherein the sensing circuit is further configured to determine the logic state as a first value indicating that the monitored temperature is above the pre-defined threshold temperature.

17. The device of claim 16, wherein the sensing circuit is further configured to determine the logic state as a second value opposite to the first value indicating that the monitored temperature is below the pre-defined threshold temperature.

18. The device of claim 17, further comprising:
a counter circuit, coupled to the sensing circuit, and configured to count respective numbers of the first and second values.

19. The device of claim 18, further comprising:
a comparator circuit, coupled to the counter circuit, and configured to compare the number of the first value with a pre-defined number so as to allow the control logic circuit to further determine whether the monitored temperature is above the pre-defined threshold temperature, and compare the number of the second value with the pre-defined number so as to allow the control logic circuit to further determine whether the monitored temperature is below the pre-defined threshold temperature.

20. A method for monitoring an environmental temperature, comprising:
providing a first conductive line and a second conductive line, wherein the first and second conductive line have respective different cross-sectional widths;
charging the first and second conductive lines to a common voltage level in response to periodically receiving a pre-charge enable signal;
discharging the first and second conductive lines under the monitored environmental temperature;
determining a current logic state based on a voltage difference of respective discharging voltage levels present on the first and second conductive lines, wherein the determined logic state indicates a value of the monitored environmental temperature; and
determining whether the environmental temperature is above or below a pre-defined threshold temperature based on whether the current logic state is flipped from a previous logic state.

* * * * *